United States Patent

Morgan et al.

Patent Number: 5,138,177
Date of Patent: Aug. 11, 1992

[54] SOLID-STATE RELAY

[75] Inventors: Mark C. Morgan, Scranton; Craig B. Ziemer, Earl Township, Lancaster County, both of Pa.

[73] Assignee: AT&T Bell Laboratories, Murray Hill, N.J.

[21] Appl. No.: 678,573

[22] Filed: Mar. 26, 1991

[51] Int. Cl.[5] .............................. G02B 27/00
[52] U.S. Cl. ........................ 250/551; 307/311
[58] Field of Search .................. 250/551; 307/311

[56] References Cited

U.S. PATENT DOCUMENTS

| | | | |
|---|---|---|---|
| 3,321,631 | 5/1967 | Biard et al. | 307/311 |
| 3,524,986 | 8/1970 | Harnden, Jr. | 307/311 |
| 4,039,863 | 8/1977 | Ohhinata et al. | 307/311 |
| 4,227,098 | 10/1980 | Brown et al. | 307/311 |
| 4,268,843 | 5/1981 | Brown et al. | 307/311 |
| 4,303,831 | 12/1981 | El Hamamsy | 307/311 |
| 4,390,790 | 6/1983 | Rodriguez | 250/551 |
| 4,777,387 | 10/1988 | Collins | 307/311 |
| 4,859,875 | 8/1989 | Tihanyi et al. | 250/551 |
| 4,902,901 | 2/1990 | Pernyeszi | 250/551 |
| 4,912,335 | 3/1990 | Ehalt et al. | 250/551 |
| 4,931,656 | 6/1990 | Ehalt et al. | 250/551 |
| 5,045,709 | 9/1991 | Ogawa | 250/551 |

Primary Examiner—Janice A. Howell
Assistant Examiner—Kiet T. Nguyen
Attorney, Agent, or Firm—Scott W. McLellan

[57] ABSTRACT

A circuit technique for reducing the sensitivity of solid-state relays, having a normally-on (closed) contact, to transients on the output thereof when the contact is open (relay is actuated). The relay has series of photodiodes, a switch, and a pair of depletion type output transistors coupled to the output of the relay. The output transistors are driven by the photodiodes with the switch in parallel with the input of the transistors. The switch allows for the rapid deactuation of the relay. A resistor, disposed in series with the switch, reduces the susceptibility of the relay to the transients by slowing the turn-on of the switch.

15 Claims, 2 Drawing Sheets

SOLID-STATE RELAY

BACKGROUND OF THE INVENTION

1. Field of the Invention

This invention relates to solid state relays in general and, more particularly, to solid-state relays with a normally-closed contact.

2. Description of the Prior Art

The reliability, speed, quietness, and efficiency of solid-state relays make them an attractive alternative to mechanical (electromagnetically operated) relays. As a result, solid-state relays have significantly displaced mechanical relays in low and medium power applications.

Relays are typically of two basic forms, form A (normally-open) and form B (normally closed). Multiple action relays, such as single-pole, double throw, relays (form C) are a combination of the form A and form B relays.

Most solid-state relays are the normally-open, form A, (normally-off) type where the relay is non-conducting until actuated. This type of relay implemented either in monolithic form in hybrid form where the individual components are fixed to a non-conducting substrate, such as a ceramic or polyimid plate.

The normally-closed, form B, (normally-on) solid-state relay is less commonly found. Most form B relays are hybrid arrangements, as discussed above. One of the primary reasons that the normally-closed relay is not found in monolithic form is the susceptibility of the relay to transients on its output terminals when in the open state. It is known that monolithic, form B, solid-state relays become conductive if a transient of a sufficient magnitude and slew rate occurs across the output terminals of the relay in its non-conducting (actuated) state. For example, if the form B relay is controlling a motor or some other inductive load, when the relay is actuated, a transient is generated by the collapsing magnetic field within the motor. Without proper suppression of the transient (snubbing), the relay may be destroyed. Even with good snubbing, the transient may be of sufficient magnitude and slew rate to induce the relay to turn back on.

It is therefore desirable to reduce the susceptibility of normally-on solid-state relays to transients.

SUMMARY OF THE INVENTION

Solid-state relays generally have at least one output transistor and a switch means. The output transistor has an input terminal and two output terminals and is responsive to a control signal, the control signal controlling the state of the relay (open or closed). The output terminals are coupled to the output terminals of the relay. The switch means discharged the input terminal of the transistor to a first one of the two output terminals of the transistor when the control signal is substantially removed. The solid-state relay, according to the invention, is characterized by means, coupled to the switch means, for slowing the discharging of the input terminal of the output transistor by the switch means.

BRIEF DESCRIPTION OF THE DRAWING

The foregoing features of this invention, as well as the invention itself, may be more fully understood from the following detailed description of the drawings, in which.

DETAILED DESCRIPTION

For purposes here, a relay is actuated, or operated, when a control signal is applied. Generally, a relay has two states, an unactuated state (the "normal" state) and an actuated state. For form B relays, the unactuated state is normally-on, meaning there is a low resistance between its output terminals, i.e., the contacts are "closed". Conversely, when a form B relay is actuated, a high resistance path exists between the output terminals, i.e., the contacts are "open".

Figure 1:
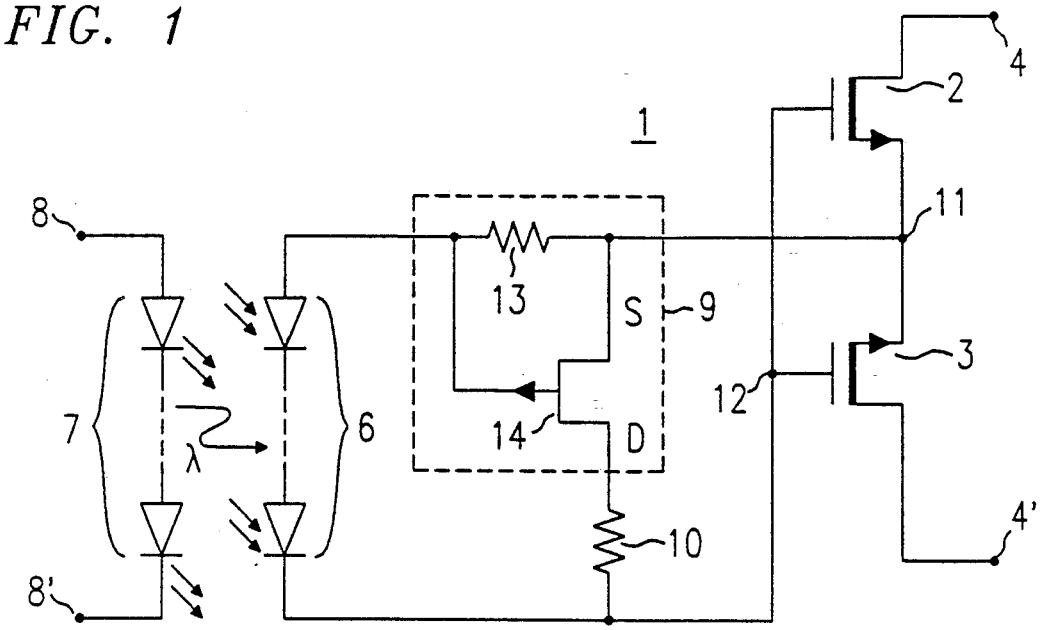
FIG. 1 is a schematic drawing of an solid-state relay according to the preferred embodiment of the invention.

The invention may be understood generally from the solid-state relay 1 shown in FIG. 1. Briefly, and in accordance with the preferred embodiment of the invention, the relay 1 has a pair of output transistors 2,3 connected to a pair of output terminals 4,4'. Coupling means (photodiodes 6) coupled a control signal from input terminals 8,8' to the common input (gate) terminals (node 12) of the transistors, 2,3. A switch 9 allows for the rapid discharge of the input terminals (node 12) to an output terminal (node 11) of transistors 2,3 by turning-on when the control signal is substantially removed. Added in series with the switch 9 is a resistor 10 which delays switch 9 from discharging the input terminals of transistors 2,3, thereby reducing the susceptibility of relay 1 to transients which may occur across the output terminals 4,4'.

The operation of relay 1 (FIG. 1) may be better understood by examining the circuit in more detail. As discussed above, the output transistors 2,3 are connected to the output terminals 4,4' of the relay 1. The transistors 2,3 are shown here as depletion mode, N-channel, diffused MOS (DMOS) transistors. Transistors 2,3 are normally conducting until a sufficiently negative voltage is applied to their gates to turn the transistors off. Therefore, in this embodiment, the relay 1 is a normally-on (form B) relay. The two transistors 2,3 are disposed in series to control currents of any polarity applied to the terminals 4,4'. Although not shown, there are integral diodes disposed between the source and drain of corresponding transistors 2,3 to protect the corresponding transistor if the transistor is reverse biased. The transistors 2,3 have a common output (source) node 11 (here the sources of the transistors 2,3) and a common gate node 12, between the voltage to control the transistors 2,3 is applied.

The array 6 generates a voltage and a current when illuminated by an array of light emitters 7 (typically one or more light emitting diodes), which is coupled to a pair of input terminals 8,8' to which the relay control signal is applied. The generation of a voltage and current by the array 6 is well understood and will not be discussed here. It is sufficient to state that the array 6 acts like a battery of predetermined voltage when the array is illuminated. Typically, the predetermined voltage is more than sufficient to fully turn off the transistors 2,3. The current generated by the array 6 charges the gate to source capacitance of the transistors 2,3 until the predetermined voltage across the transistors 2,3 is substantially reached, thereby activating the relay 1. The current flow from the array 6 then substantially stops. The switch 9, which is both in series with the array 6 and in parallel with the transistors 2,3, remains substantially non-conducting while the relay 1 is activated, i.e., while array 6 is being illuminated by emitters 7. However, when the relay 1 is deactivated (the illumination of the array 6 is substantially removed), the switch 9 turns on and quickly discharges the gate-to-source capacitance of the transistors 2,3. The advantage of the switch 9 is its ability to make the relay 1 respond quickly to deactivation as well as activation.

The switch 9, in the preferred embodiment, has a current sensing resistor 13, having a typical value of many megaohms, and a junction field-effect transistor (JFET) 14. The JFET 14 is shown here as a P-channel, depletion mode, transistor. While the gate-to-source capacitance of transistors 2,3 are being charged during the initial activation of the relay, the voltage drop across the resistor 13 keeps the transistor 14 from conducting. After the gate capacitance of transistors 2,3 is substantially charged, the voltage drop across resistor 13 decreases, allowing the transistor 14 to conduct. The amount of conduction by transistor 14 is still limited to a relatively small amount by virtue of resistor 13 dropping a voltage proportional to the current through transistor 14. However, once the array 6 is no longer generating a voltage/current, the voltage drop across resistor 13 is substantially reduced and the transistor 14 conducts heavily, quickly discharging the gate capacitance of transistors 2,3.

In accordance with one feature of the invention, the addition of resistor 10 slows the discharge of the gate-to-source capacitance of the transistors 2,3 by approximately the RC time constant created by the resistor 10 and the gate-to-source capacitance of transistors 2,3. The effect of the slowing of the discharge of the gate-to-source capacitance is the reduction in the speed at which the transistors 2,3 turn on. It has been discovered that the reduction in turn-on speed of transistors reduces the susceptibility of relay 1 to transients, as discussed above. Alternatively, the resistor 10 may be placed in series with the source of the JFET 14.

Figure 2:
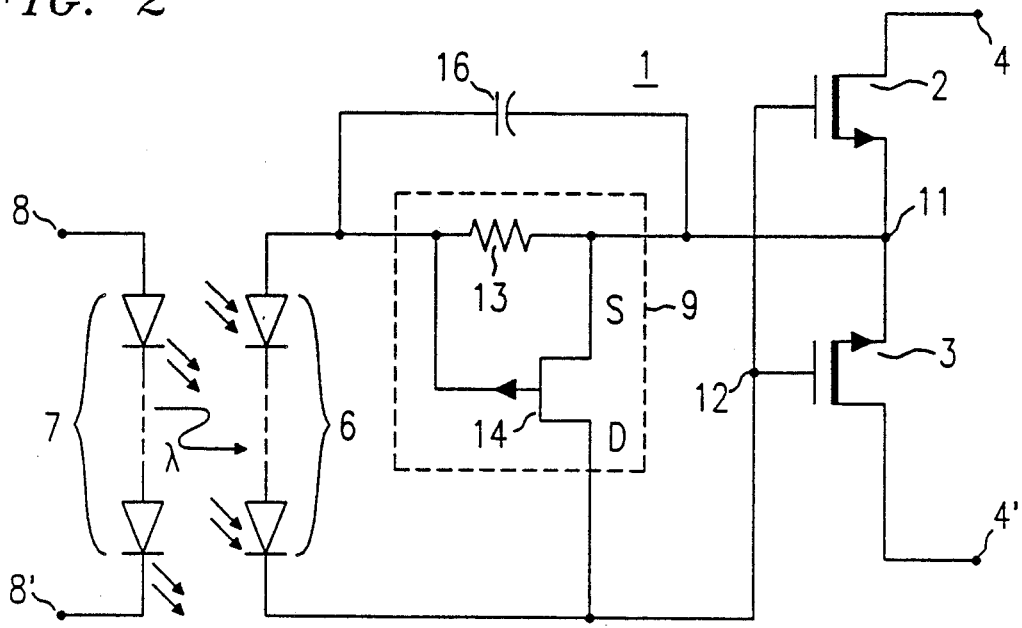
FIG. 2 is a schematic diagram of the solid-state relay according to another embodiment of the invention.

An alternative approach to delaying the turn-on of the switch 9 is shown in FIG. 2. Here, a capacitor means 16, disposed between the gate and source of JFET 14, slows the turn-on of JFET 14 when the array 6 is no longer generating a voltage/current, as discussed above.

Figure 3:
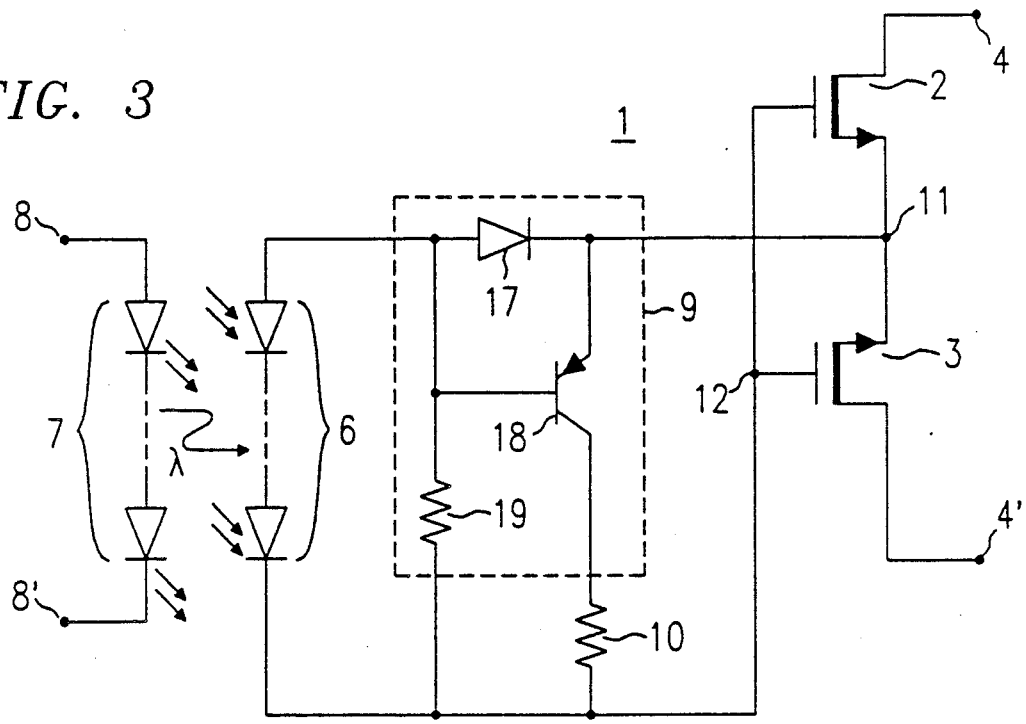
FIG. 3 is a schematic diagram of the solid-state relay according to still another embodiment of the invention.

In FIG. 3, an alternative arrangement for switch 9 is shown. Instead of a current sensing resistor/JFET arrangement, a diode 17, bipolar transistor 18, and pull-up resistor 19 are used. The diode 17 allows the array 6 to quickly charge up the gates of transistors 2,3 while keeping transistor 18 substantially non-conducting. Once the array 6 no longer generates any substantial voltage/current, transistor 18 conducts, by virtue of current passing through resistor 19, and the gate capacitance of transistors 2,3 is rapidly discharged. As discussed above, adding resistor 10 in series with the switch 9 slows the discharge of the gate-to-source capacitance of transistors 2,3 by switch 9, substantially reducing the susceptibility of the relay 1 to transients.

Figure 4:
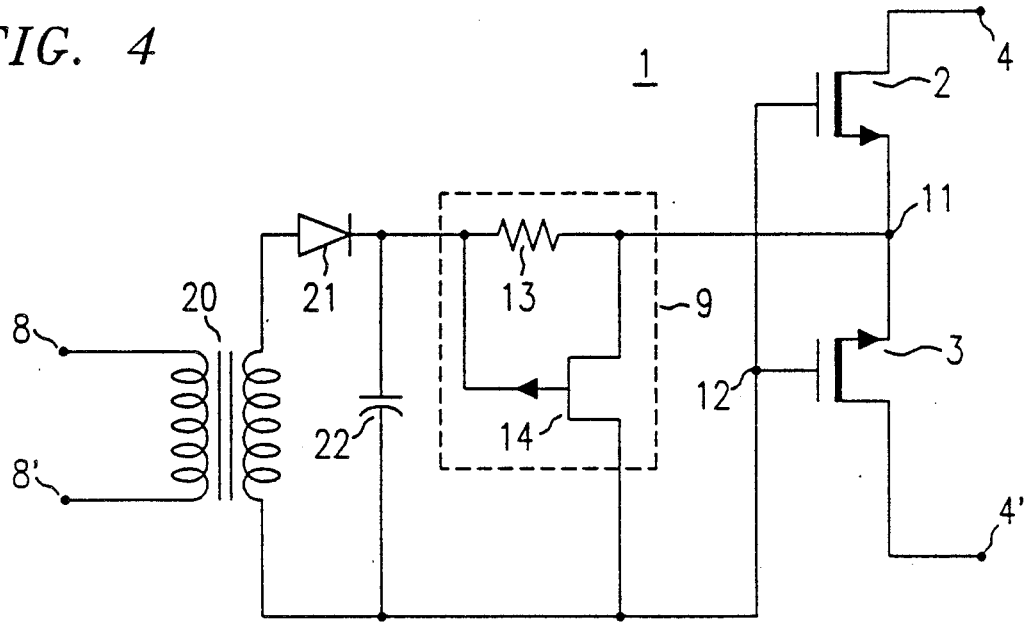
FIG. 4 is a schematic diagram of the solid-state relay according to yet another embodiment of the invention.

An alternative technique of controlling the relay 1 is shown in FIG. 4. Instead of an emitter array 7 and a photodiode array 6, a transformer 20, rectifier 21 and filter capacitor 22 is provided. AC control signals applied to the input terminals 8,8' are magnetically coupled to the diode 21 which rectifies the signals to provide a DC control voltage and current for controlling the transistors 2,3. Capacitor 22 smooths out the rectified control signals from the diode 21.

EXAMPLE

For the embodiment shown in FIG. 1, the following component values were used to build a monolithic, 350 volt, 150 mA, form B relay:

| | |
|---|---|
| transistors 2,3 | 600 × 2000 μm |
| photodiode array 6 | 25 — 180 × 180 μm isolated photodiodes |
| resistor 10 | 2MΩ |
| resistor 13 | 15MΩ |
| transistor 14 | 180 × 180 μm |

This relay was not affected by a 350 volt, 1000 /Vμs transient applied to its output terminals when the relay contacts were "open" (actuated). The same relay without resistor 10 failed (became conductive) when a 350 volt, 15 V/μs transient was applied to the output terminals thereof.

While the embodiments shown here are for form B relays, the invention may be applied to other forms of relays, such as form C relays. Further, the transistors polarity types are exemplary and may be reversed with the attendant change in voltage polarities, such as the voltage/current provided by the photodiode array 6.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:
1. A normally closed solid-state relay having:
   at least one output transistor having an input terminal and two output terminals, the output terminals coupling to the output of the relay, the transistor being responsive to a control signal; and,
   switch means for discharging the input terminal of the output transistor to a first one of the two output terminals of the output resistor upon substantial removal of the control signal;
   characterized by:
   means, coupled to the switch means, for slowing the discharging of the input terminal by the switch means;
   wherein the control signal determines whether the relay is substantially conducting or non-conducting.

2. The solid-state relay as recited in claim 1, wherein the slowing means has a resistive means in series with the switch means.

3. The solid-state relay as recited in claim 1, wherein the slowing means has capacitive means coupled thereto.

4. The solid-state relay as recited in claims 2 or 3, wherein the relay is further characterized by a coupling means, coupled to the input terminal of the output transistor, for coupling the control signal to the output transistor.

5. The solid-state relay as recited in claim 4, wherein the switch means has a transistor and a sensing means, the transistor being coupled between the input and the first one of the output terminals of the output transistor, the sensing means being disposed between the coupling means and the output transistor to sense the control signal from the coupling means.

6. The solid-state relay as recited in claim 5, wherein the coupling means has a plurality of photodiodes.

7. The solid-state relay as recited in claim 6, wherein the sensing means has a resistor.

8. The solid-state relay as recited in claim 7, wherein the transistor is a junction FET and the output transistor is two DMOS transistors with drain nodes, a common gate node, an a common source node, the drain nodes coupling to corresponding relay output terminals and the source and gate nodes coupling to the switch means.

9. A normally closed, monolithic, solid-state relay having:
   a pair of output terminals;
   a pair of output transistors, the output terminals thereof coupled in series to form an common output terminal, the remaining output terminal of each transistor coupling to corresponding relay output terminals, and the input terminals coupled together to form a common input terminal;
   coupling means, responsive to a control signal and coupled to the common input terminal of the output transistors, for coupling the control signal to the output transistors; and
   a switch means, coupled to the common input terminal and the common output terminal of the pair of output transistors, for selectively discharging the common input to the common output terminals upon substantial removal of the control signal; characterized by:
   means, coupled to the switch means, for slowing the discharging of the common input of the output transistors by the switch means.

10. The solid-state relay as recited in claim 9, wherein the slowing means has a resistive means disposed in series with the switch means.

11. The solid-state relay as recited in claim 9, wherein the slowing means has capacitive means.

12. The solid-state relay as recited in claims 10 or 11, wherein the switch means has a transistor and a sensing means, the transistor being coupled between the input and the first one of the output terminals of the output transistor, the sensing means being disposed between the coupling means and the output transistor to sense the control signal from the coupling means.

13. The solid-state relay as recited in claim 12, wherein the coupling means has a plurality of photodiodes.

14. The solid-state relay as recited in claim 13, wherein the sensing means has a resistor.

15. The solid-state relay as recited in claim 14, wherein the transistor is a junction FET and the output transistor are two DMOS transistors with drain nodes, a common gate node, and a common source node, the drain nodes coupling to corresponding relay output terminals, the common source node being the common output terminal, and the common gate node being the common input terminal.

* * * * *